(12) United States Patent
Rückerl

(10) Patent No.: US 10,465,284 B2
(45) Date of Patent: Nov. 5, 2019

(54) METHOD OF PRODUCING AN APPARATUS, APPARATUS AND OPTOELECTRONIC COMPONENT

(71) Applicant: OSRAM Opto Semiconductors GmbH, Regensburg (DE)

(72) Inventor: Andreas Rückerl, Konzell (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/745,084

(22) PCT Filed: Sep. 29, 2016

(86) PCT No.: PCT/EP2016/073345
§ 371 (c)(1),
(2) Date: Jan. 15, 2018

(87) PCT Pub. No.: WO2018/059702
PCT Pub. Date: Apr. 5, 2018

(65) Prior Publication Data
US 2019/0010607 A1 Jan. 10, 2019

(51) Int. Cl.
*C23C 16/40* (2006.01)
*C23C 16/455* (2006.01)
(Continued)

(52) U.S. Cl.
CPC ...... *C23C 16/403* (2013.01); *C23C 16/45525* (2013.01); *C23C 16/56* (2013.01);
(Continued)

(58) Field of Classification Search
CPC . H01L 51/56; H01L 51/5072; H01L 51/0097; H01L 2251/5338; H01L 51/5056
(Continued)

(56) References Cited

U.S. PATENT DOCUMENTS 5,496,529 A * 3/1996 Fogel ................ C01B 25/36
423/305
6,380,560 B1 * 4/2002 Yamazaki ............ H01L 29/04
257/290

(Continued)

FOREIGN PATENT DOCUMENTS

DE  102007052181 A1  4/2009
EP     2653453 A1   10/2013
JP    2007243023 A    9/2007

OTHER PUBLICATIONS

De Lange, R.S.A. et al., "Formation and Characterization of Supported Microporous Ceramic Membranes Prepared by sol-gel Modification Techniques," Journal of Membrane Science 99, 1995, 19 pages.
(Continued)

*Primary Examiner* — Andy Huynh
(74) *Attorney, Agent, or Firm* — Slater Matsil, LLP (57) ABSTRACT

A method for producing an apparatus, an apparatus and an optoelectronic component are disclosed. In an embodiment the method includes providing a carrier, depositing an amorphous ALD layer on the carrier using an ALD method and recrystallizing the amorphous ALD layer into a crystalline layer.

17 Claims, 4 Drawing Sheets

(51) Int. Cl.
*C23C 16/56* (2006.01)
*H01L 51/52* (2006.01)
*H01L 33/44* (2010.01)

(52) U.S. Cl.
CPC .......... *H01L 33/44* (2013.01); *H01L 51/5253* (2013.01); *H01L 51/5268* (2013.01); *H01L 2933/0025* (2013.01); *H01L 2933/0091* (2013.01)

(58) Field of Classification Search
USPC .......................................................... 257/98
See application file for complete search history.

(56) References Cited

U.S. PATENT DOCUMENTS

| | | |
|---|---|---|
| 2004/0021401 A1 | 2/2004 | Ando |
| 2004/0126983 A1 | 7/2004 | Kim |
| 2008/0254231 A1 | 10/2008 | Lin et al. |
| 2009/0091258 A1 | 4/2009 | Heuser et al. |
| 2010/0266844 A1* | 10/2010 | Jensen .................... B01J 3/008 428/402 |

OTHER PUBLICATIONS

Meyer, J. et al., "Al2O3/ZrO2 Nanolaminates as Ultrahigh Gas-Diffusion Barriers—A Strategy for Reliable Encapsulation of Organic Electronics," XP-002586026, Advanced Materials, vol. 21, No. 18, Feb. 19, 2009, 5 pages.

Rückerl, A. et al., "Temperature and Humidity Dependence of ALD-Al2O3 Degradation in (opto-) Electronic Devices," 19th Workshop on Dielectrics in Microelectronics, Hotel Baia Verde, Aci Castello (Castania), Italy, Jun. 27-30, 2016, 25 pages.

Rückerl, A. et al., "Temperature and Humidity Dependence of ALD-Al2O3 Degradation," 19th Workshop on Dielectrics in Microelectronics, Hotel Baia Verde, Aci Castello (Castania), Italy, Jun. 27-30, 2016, 3 pages.

Vitorino, N. et al., "Hydrothermal Synthesis of Boehmite in Cellular Alumina Monoliths for Catalytic and Separation Applications," Journal of the European Ceramic Society 35, 2015, 7 pages.

* cited by examiner

METHOD OF PRODUCING AN APPARATUS, APPARATUS AND OPTOELECTRONIC COMPONENT

This patent application is a national phase filing under section 371 of PCT/EP2016/073345, filed Sep. 29, 2016, which is incorporated herein by reference in its entirety.

TECHNICAL FIELD

A method of producing an apparatus, an apparatus and an optoelectronic component are provided.

SUMMARY OF THE INVENTION

Embodiments of the invention provide a method for producing an apparatus having a layer that is catalytically active. Further embodiments provide an apparatus of this type and an optoelectronic component having an apparatus of this type.

In various embodiments a carrier is provided for producing an apparatus. On the carrier, an amorphous ALD layer is deposited with the aid of an ALD method. Particularly preferably, the amorphous ALD layer has a thickness of between 10 nanometers and 200 nanometers inclusive.

In various further embodiments the temperature at which the ALD layer is deposited on the carrier is between room temperature and 400° C. inclusive and particularly preferably between 80° C. and 300° C. inclusive. In general, the higher the temperature at which the ALD layer is deposited, the more ordered will be the deposited ALD layer.

In an ALD (atomic layer deposition) method, the surface to be coated is made available in a volume. At least one first gaseous starting material is supplied to the volume, and is adsorbed on the surface to be coated. After preferably complete or almost complete coverage of the surface to be coated with the first starting material in a self-limiting reaction process, the part of the first starting material that is still gaseous or has not been adsorbed on the surface is generally removed from the volume again and a second starting material is supplied to the volume. The second starting material is intended to react chemically with the first starting material adsorbed on the surface to form a solid ALD layer in a self-limiting reaction process. Furthermore, the solid ALD layer is in general at least partly coupled covalently to the surface to be coated.

In further embodiments the ALD method is therefore distinguished by at least one chemical reaction on the surface to be coated, to form the ALD layer. The chemical reaction here is generally self-limiting, such that atomic layer growth takes place during the ALD method.

In the ALD method, two self-limiting processes may generally take place, namely the adsorption of the first starting material on the surface to be coated and the chemical reaction to form the ALD layer. These self-limiting processes contribute to preventing uncontrolled growth of the layer to be deposited and promoting atomic layer growth.

Generally, the chemical reaction takes place at a certain reaction temperature. Particularly preferably, the surface to be coated is at the reaction temperature at which the chemical reaction to form the solid ALD layer takes place. In the ALD method it is also possible to employ more than two starting materials.

Compared to other deposition methods from the vapor phase, such as a CVD (chemical vapor deposition) method, an ALD method is distinguished in particular by the fact that the respective starting materials for the chemical reaction to form the layer to be deposited are let into the volume separately from one another and parts of the starting materials that have not been adsorbed or chemically reacted are removed from the volume again before a further starting material is fed into the volume. The ALD method has the advantage of allowing particularly good control of the layer thickness of the layer being deposited. Furthermore, using an ALD method, a patterned surface can be overmolded very easily with a high aspect ratio. This means that the structure of the surface to be coated is also accurately reproduced in detail in the surface of the deposited ALD layer.

The ALD layer deposited by an ALD method is generally distinguished in particular by a very homogeneous layer thickness and by a very homogeneous layer structure. In particular, the ALD layer generally has few defects, such as, e.g., pinholes, and a high density. The density of the ALD layer here is generally heavily dependent on the temperature during deposition.

According to a preferred embodiment of the method, the amorphous ALD layer is recrystallized into a crystalline layer. The crystalline layer can also be in microcrystalline form in this case. This means that only small sub-regions of the crystalline layer, so-called grains, have a common crystal lattice, the sub-regions being firmly connected to one another, however, and only separated from one another by grain boundaries.

In the recrystallization of the amorphous ALD layer, the amorphous material of the amorphous ALD layer is at least partly converted to a crystalline or microcrystalline material.

Furthermore, the crystalline layer does not necessarily have to be completely recrystallized. Instead, it is possible that only part of the amorphous ALD layer is recrystallized. For example, the crystalline layer has a gradient in terms of its degree of crystallization along its normal, in which the degree of crystallization decreases from a main surface facing away from the carrier to a main surface facing towards the carrier. It is also possible here for a thin residual layer of the amorphous ALD layer to be present, but in the present case this is also included as part of the crystalline layer.

For example, the crystalline layer has a degree of crystallization of at least 80 vol. %. The crystalline layer preferably has a degree of crystallization of at least 85 vol. % and particularly preferably of at least 90 vol. %.

According to one embodiment, the surface of the carrier on which the amorphous ALD layer is to be deposited is pretreated with gaseous water before the ALD method.

Particularly preferably, the amorphous ALD layer comprises or consists of aluminum oxide ($Al_2O_3$).

According to a preferred embodiment of the method, the amorphous ALD layer comprises or consists of aluminum oxide which has been converted by recrystallization to crystalline or microcrystalline γ-AlOOH (aluminum oxyhydroxide), so that the crystalline layer comprises or consists of crystalline or microcrystalline γ-AlOOH. Crystalline or microcrystalline γ-AlOOH is also known as boehmite and has an orthorhombic crystal structure. The crystalline material of the crystalline layer here does not necessarily have to be formed completely by crystalline γ-AlOOH. Instead, it is also possible that a small proportion of the crystalline material of the crystalline layer comprises another phase of aluminum hydroxide.

Compared with the production of microcrystalline γ-AlOOH in aqueous suspensions by hydrothermal-assisted precipitation reactions in which only small particles of γ-AlOOH are formed, it is advantageously possible using the method described here to coat a comparatively large area with γ-AlOOH and also γ-Al$_2$O$_3$. Thus, for example, a wafer with several-inch diameters, e.g., with a 6-inch diameter, can be coated with a homogeneous layer comprising crystalline or microcrystalline γ-AlOOH. A layer of this type can advantageously be employed particularly effectively for catalysis. The crystalline layer here can advantageously be formed with very few defects and with a thickness that is as homogeneous as possible over a relatively large area, such as at the level of a wafer. The production of such a crystalline layer is made possible in particular with the aid of the deposition of the amorphous ALD layer as a starting layer by an ALD method, since in this case a particularly homogeneous and defect-free ALD layer is formed on the carrier as a starting layer for the method described. Furthermore, the inventors of the present application have discovered how such an amorphous ALD layer deposited by an ALD method can be converted to a crystalline or microcrystalline layer comprising γ-AlOOH.

Furthermore, the method described here has the advantage of being able to dispense with a joining method such as adhesive bonding for attaching the crystalline layer to the carrier. The crystalline layer in the present case is advantageously produced directly on the carrier and not produced spatially separately from the carrier and then applied thereon in a separate joining step.

According to an embodiment of the method, the recrystallization of the ALD layer takes place by exposing it to temperature and/or humidity and/or pressure (hydrothermal method). The values of the temperature and/or humidity and/or pressure in this case are particularly preferably significantly above the values of atmospheric air. Particularly preferably, the temperature, the humidity and the pressure of the medium surrounding the amorphous ALD layer are all elevated compared with the ambient air.

For example, the recrystallization of the amorphous ALD layer can take place by exposure to a temperature of between 100° C. and 140° C. inclusive. In particular, a recrystallization of an amorphous ALD layer comprising or consisting of aluminum oxide can preferably take place by exposure to a temperature of between 100° C. and 140° C. inclusive. The amorphous ALD layer here preferably recrystallizes at least partly into crystalline or microcrystalline γ-AlOOH.

Furthermore, exposure to a pressure of between 1 mbar and 3.0 bar inclusive is suitable for the recrystallization of the amorphous ALD layer. In particular, a recrystallization of an amorphous ALD layer comprising or consisting of aluminum oxide can preferably take place by exposure to a pressure of between 1 mbar and 3.0 bar inclusive. The amorphous ALD layer here preferably recrystallizes at least partly into crystalline or microcrystalline γ-AlOOH.

According to a further embodiment of the method, the recrystallization of the amorphous layer takes place by exposure to humidity in which the water content of a gaseous medium at least partly surrounding the amorphous ALD layer is between 50% and 100% relative humidity inclusive. For example, the gaseous surrounding medium is air. In particular, a recrystallization of an amorphous ALD layer comprising or consisting of aluminum oxide can preferably take place by exposure to humidity in which the water content of a gaseous medium at least partly surrounding the amorphous ALD layer is between 50% and 100% relative humidity inclusive. The amorphous ALD layer here preferably recrystallizes at least partly into crystalline or microcrystalline γ-AlOOH.

As described above, it is possible that the water content of the gaseous medium at least partly surrounding the amorphous ALD layer is 100% relative humidity. Preferably, however, the upper limit for the water content is 99%. In this way, condensation of water on the ALD layer, which can lead to damage to the crystalline layer, can be avoided particularly effectively. Particularly preferably, the water content of the gaseous medium at least partly surrounding the amorphous ALD layer is 95% relative humidity.

For example, the recrystallization of the amorphous layer can be performed in an autoclave. The autoclave in this case preferably has a closed volume containing a gaseous medium, generally air. Preferably in this case, an elevated temperature, e.g., between 100° C. and 140° C. inclusive, is first set within a closed volume of the autoclave and then an elevated humidity of the surrounding medium, e.g., between 50% and 100% inclusive, is set. If the elevated temperature is set first and the humidity of the gaseous medium in the autoclave is increased only afterwards, advantageously no condensation or only very slight condensation of liquid water takes place on the surface of the amorphous ALD layer. As a result of this, damage to the amorphous ALD layer is advantageously reduced.

According to a further embodiment of the method, the exposure of the amorphous layer to temperature and/or humidity and/or pressure takes place for a period of between one hour and 17 hours inclusive. The higher the temperature at which the amorphous ALD layer is deposited, the longer the recrystallization of the amorphous ALD layer into the crystalline layer will generally take.

For example, an amorphous ALD layer comprising or consisting of Al$_2$O$_3$ can be recrystallized at a temperature of approximately 124° C., an atmospheric humidity of approximately 95% and a pressure of approximately 2.14 bar, so that the amorphous material Al$_2$O$_3$ of the amorphous ALD layer is converted to crystalline or microcrystalline γ-AlOOH. These conditions can be set, e.g., in an autoclave in which the volume of the autoclave is first heated to approximately 124° C. and then an atmospheric humidity of approximately 95% is set. In this case, a pressure of approximately 2.14 bar is generally obtained in the volume of the autoclave. The period of exposure to the above temperature, pressure and atmospheric humidity in this case is, e.g., between one hour and 17 hours inclusive. Generally, the period of exposure depends on the thickness of the ALD layer. For instance, the recrystallization of a thick ALD layer takes longer than the recrystallization of a thin ALD layer.

According to a further embodiment of the method, the amorphous ALD layer is exposed to temperature and/or humidity and/or pressure for the purpose of recrystallization, the temperature and/or humidity and/or pressure being varied. For example, the amorphous ALD layer is exposed to humidity for recrystallization and the humidity is varied. For instance, the humidity for recrystallization in the medium surrounding the amorphous ALD layer can be set at between 50% and 100% inclusive in a first time period and reduced in a second time period. The first time period and the second time period here can be repeated alternately multiple times. This can be performed, e.g., in an autoclave by returning the elevated humidity in the volume of the autoclave to the normal value of the ambient air after a first time period and setting it to an elevated value again after the second time period.

According to a further embodiment of the method, the crystalline layer comprises γ-AlOOH and is converted at least partly to crystalline γ-Al$_2$O$_3$ by a further annealing step. The annealing is particularly preferably performed at a temperature of between 500° C. and 600° C. inclusive. Crystalline γ-Al$_2$O$_3$ generally has a cubic lattice structure. It is also possible in this case that the material of the crystalline γ-AlOOH layer is converted to microcrystalline γ-Al$_2$O$_3$.

Particularly preferably, the crystalline layer is catalytically active. Particularly preferably, a crystalline layer comprising crystalline γ-AlOOH or crystalline γ-Al$_2$O$_3$ is catalytically active. The crystalline layer can be used as a catalyst or catalysis substrate. In particular, a crystalline layer comprising crystalline γ-AlOOH or crystalline γ-Al$_2$O$_3$ can be used as a catalyst or catalysis substrate. For instance, crystalline γ-AlOOH can be used, e.g., for the reaction of sulfur.

An apparatus preferably has a carrier on which a crystalline layer is attached in a mechanically stable manner and without a joining layer. In particular, the crystalline layer is not adhesively bonded thereon. The crystalline layer preferably comprises or consists of crystalline γ-AlOOH. Alternatively, it is also possible that the crystalline layer comprises or consists of crystalline γ-Al$_2$O$_3$. An apparatus of this type can be produced in particular by the method described here. All the features described above in association with the method can therefore also be present in the apparatus and vice versa. In particular, the features described above in association with the crystalline layer can be present in the crystalline layer of the apparatus.

Particularly preferably, the crystalline layer is in direct contact with a main surface of the carrier, particularly preferably completely along a main surface of the carrier. Particularly preferably, the crystalline layer is covalently coupled to the carrier.

According to an embodiment of the apparatus, the carrier comprises or is formed using one of the following materials: a III/V compound semiconductor material, germanium, silicon, glass.

The III/V compound semiconductor material can be, e.g., a nitride compound semiconductor material. Nitride compound semiconductor materials are compound semiconductor materials containing nitrogen, such as the materials from the system In$_x$Al$_y$Ga$_{1-x-y}$N with 0≤x≤1, 0≤y≤1 and x+y≤1.

The III/V compound semiconductor material can also be a phosphide compound semiconductor material. Phosphide compound semiconductor materials are compound semiconductor materials containing phosphorus, such as the materials from the system In$_x$Al$_y$Ga$_{1-x-y}$P with 0≤x≤1, 0≤y≤1 and x+y≤1.

Furthermore, the III/V compound semiconductor material can also be an arsenide compound semiconductor material. Arsenide compound semiconductor materials are compound semiconductor materials containing arsenic, such as the materials from the system In$_x$Al$_y$Ga$_{1-x-y}$As with 0≤x≤1, 0≤y≤1 and x+y≤1.

Preferably, the crystalline layer has a thickness of between 10 nanometers and 400 nanometers inclusive.

According to an embodiment of the apparatus, the crystalline layer has an RMS roughness (root-mean-square roughness) R$_q$ of at least 5 nanometers. In particular, during the recrystallization of the amorphous ALD layer as described here, a crystalline layer is obtained with an elevated roughness. The amorphous ALD layer generally has a very low RMS roughness, e.g., less than one nanometer. As a result of recrystallization, the roughness is increased significantly.

According to a further embodiment of the apparatus, the main surface of the carrier on to which the crystalline layer is applied has a patterning, the aspect ratio of which is at least 0.2. The patterning preferably has an aspect ratio of at least 0.5 and particularly preferably of at least 1.

In particular, an ALD method is suitable for coating a surface with a patterning having a comparatively high aspect ratio particularly homogeneously and with particularly good reproduction of surface detail. The method described here is therefore highly suitable for coating a surface with a patterning having a high aspect ratio with a crystalline layer.

The crystalline layer described here can also be used in an optoelectronic component, such as a light-emitting diode (LED) or an organic light-emitting diode (OLED). For example, because of its comparatively high roughness, the crystalline layer can be used as a light extraction layer. In this case, the crystalline layer is preferably applied at least on the light exit surface of the LED or OLED. Furthermore, it is also possible that the crystalline layer is used as a passivation layer, e.g., in an OLED as protection from external influences, such as humidity. If a crystalline layer is used in an optoelectronic component, the carrier can be in the form of, e.g., an LED chip.

BRIEF DESCRIPTION OF THE DRAWINGS

Further advantageous embodiments and developments of the invention can be taken from the exemplary embodiments described below in association with the figures.

With the aid of the sectional diagrams of FIGS. 1-4, a method of producing an apparatus according to a first exemplary embodiment is described in more detail.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements, and in particular layer thicknesses, may be exaggerated.

DETAILED DESCRIPTION OF ILLUSTRATIVE EMBODIMENTS

Figure 1:
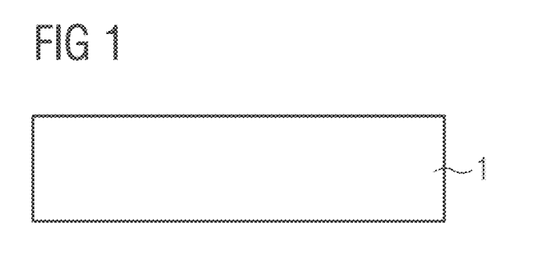

In the method according to the exemplary embodiment of FIGS. 1 to 4, a carrier 1 is first provided (FIG. 1). The carrier 1 can comprise or consist of, e.g., a nitride compound semiconductor material. For example, the carrier 1 is a wafer with a diameter of several inches.

Figure 2:
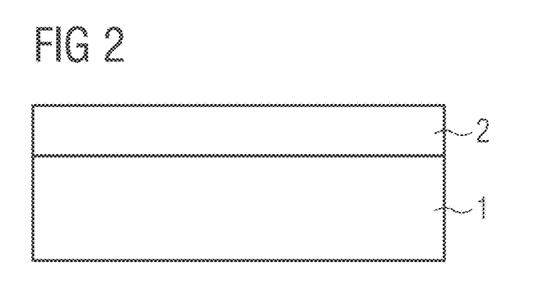

In a next step, which is illustrated schematically in FIG. 2, an amorphous ALD layer 2 consisting of or comprising Al$_2$O$_3$ is deposited on the carrier 1 with the aid of an ALD method. This layer is also referred to below as amorphous Al$_2$O$_3$ layer 2. For example, the deposition of the amorphous Al$_2$O$_3$ layer 2 takes place at a temperature of approximately 200° C. As a first starting material, Trimethylaluminium (TMA) can be used, while ozone or gaseous H$_2$O is suitable as a second starting material. The thickness of the amorphous Al$_2$O$_3$ layer 2 is, e.g., approximately 40 nanometers. The RMS roughness of the amorphous ALD layer 2 is comparatively low and is, e.g., about 0.5 nanometers.

Figure 3:
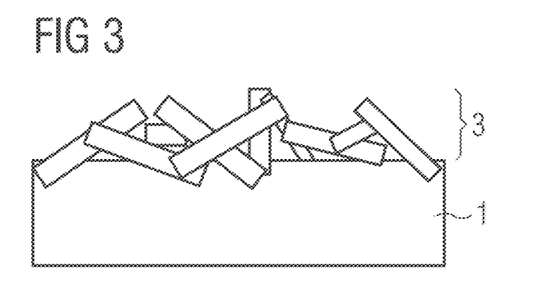

In a next step, which is illustrated schematically in FIG. 3, the amorphous Al$_2$O$_3$ layer 2 is converted hydrothermally to a crystalline layer 3, which comprises or consists of crystalline γ-AlOOH. To this end, the carrier 1 coated with the amorphous ALD layer 2 composed of aluminum oxide is introduced in the present case into the volume of an autoclave, which is initially heated to a temperature of, e.g., approximately 124° C. The humidity of the air in the volume of the autoclave is then increased to approximately 95%. As a result, a pressure of between approx. 2.1 bar and approx. 2.7 bar inclusive is generally established in the volume of the autoclave. The amorphous ALD layer 2 is then left for approximately three hours in the autoclave under the conditions that have been set. During this time, a recrystallization of the amorphous ALD layer 2 into a microcrystalline γ-AlOOH layer 3 takes place.

Figure 4:
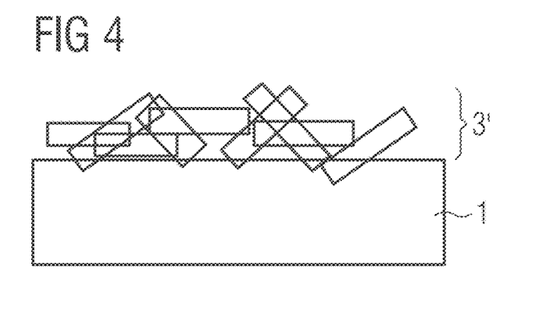

In a next step, the microcrystalline γ-AlOOH layer 3 can be further converted to a crystalline γ-$Al_2O_3$ layer 3' in an annealing step, as illustrated schematically in FIG. 4. A temperature of, e.g., approximately 500° C. is used here.

Figure 5:
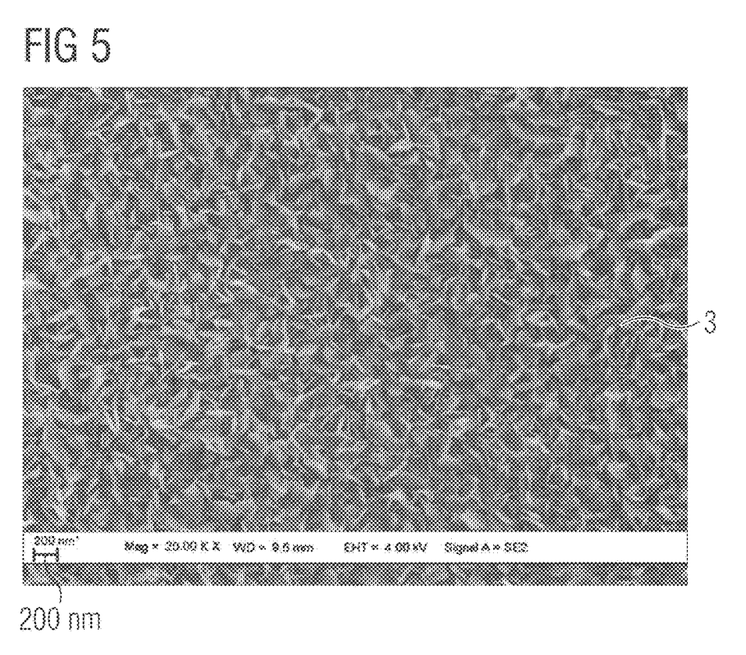
FIGS. 5 and 6 show by way of example scanning electron micrographs of a crystalline layer in two different magnifications.
Figure 6:
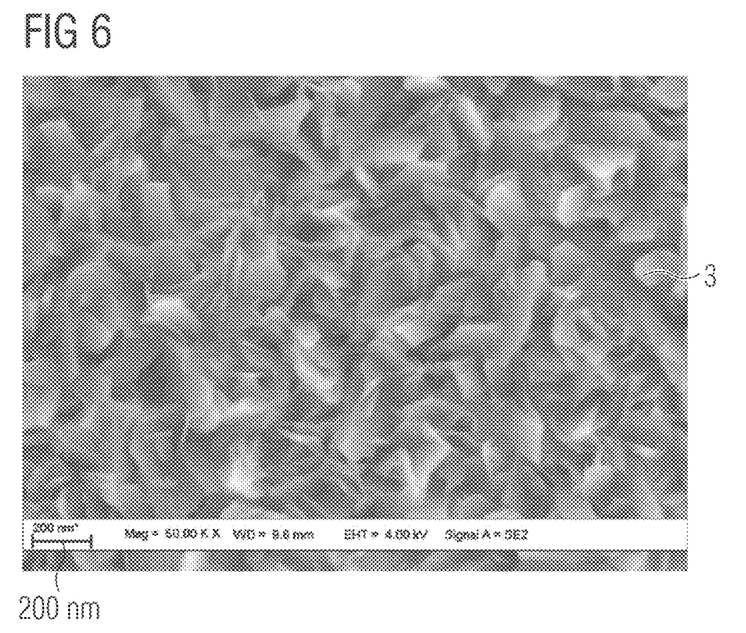

FIGS. 5 and 6 show by way of example scanning electron micrographs of the microcrystalline γ-AlOOH layer 3, as can be produced on the carrier 1, e.g., in the method according to the exemplary embodiment of FIGS. 1 to 3. The two figures here show different resolutions. The crystalline γ-AlOOH layer 3 here is formed homogeneously and over the entire area of the main surface of the carrier 1 and has a comparatively high roughness of approximately 13 nanometers. By means of the recrystallization process, a conversion of the smooth surface of the amorphous ALD layer 2 to the crystalline layer 3 with high roughness has taken place. The surface of the crystalline layer 3 shows microcrystallites and nanocrystallites of γ-AlOOH in the form of leaves or flakes. These crystallites cover the surface of the carrier 1 completely in the present case and are mechanically rigidly connected to one another. Furthermore, in the present case the thickness of the crystalline layer 3 is also significantly higher than that of the amorphous ALD layer 2.

Figure 7:
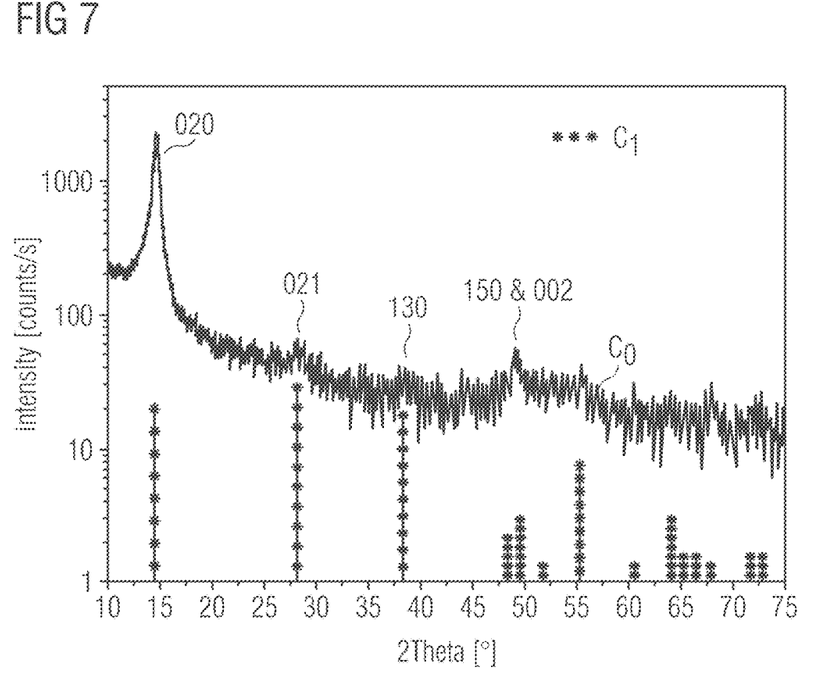
FIG. 7 shows by way of example crystallization evidence of a crystalline layer using X-ray diffractometry.

FIG. 7 shows by way of example measured values of an X-ray diffraction measurement $C_o$ on a surface which is covered with a crystalline γ-AlOOH layer 3 and is shown, e.g., in FIGS. 5 and 6. The X-ray diffraction measurement here was carried out with the $K_\alpha$ line of a copper cathode with E=8.047 keV. Furthermore, FIG. 7 shows the simulated values of an X-ray diffraction pattern of crystalline γ-AlOOH as curve $C_1$ (broken line).

On the y-axis of FIG. 7, the intensity of the diffracted X-ray radiation is plotted and on the x-axis the diffraction angle 2Theta is plotted in °. The peaks of the measured curve $C_o$ here match the peaks of the crystal planes 020, 021, 130, 150 and 002 of the simulated diffraction pattern. Using the method described here, therefore, a crystalline γ-AlOOH coating can be produced.

Figure 8:
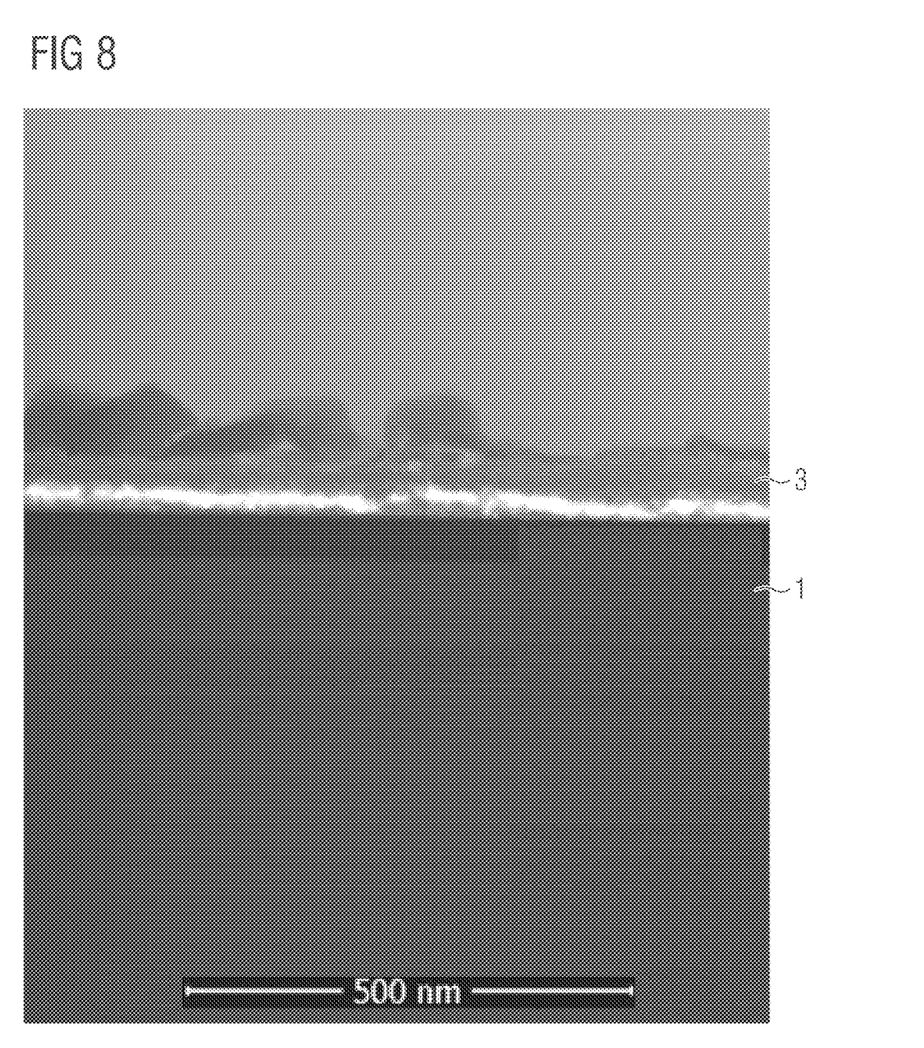
FIG. 8 shows by way of example a scanning electron micrograph of an FIB section through a crystalline layer.

FIG. 8 shows by way of example a scanning electron micrograph of an FIB section through a crystalline layer 3, as can be deposited on a carrier 1, e.g., by a method as described here. FIG. 8 shows that the degree of crystallization of the crystalline layer 3 decreases from a main surface of the carrier 1 along a normal of the crystalline layer 3. Thus, bordering the carrier 1, a thin layer of residues of the amorphous ALD layer 2 composed of aluminum oxide is still present (light spots on the SEM image), while the surface of the crystalline layer 3 is formed by γ-AlOOH crystallites.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method of producing an apparatus, the method comprising:
   providing a carrier;
   depositing an amorphous ALD layer on the carrier using an ALD method; and
   recrystallizing the amorphous ALD layer into a crystalline layer,
   wherein the amorphous ALD layer comprises aluminum oxide, which is converted by recrystallization to crystalline aluminum oxyhydroxide (γ-AlOOH) so that the crystalline layer comprises crystalline γ-AlOOH.

2. The method according to claim 1, wherein the amorphous ALD layer has a thickness between 10 nanometers and 200 nanometers inclusive.

3. The method according to claim 1, wherein the amorphous ALD layer is recrystallized by exposure to a temperature and/or a humidity and/or a pressure.

4. The method according to claim 3, wherein the temperature and/or the humidity and/or the pressure varies.

5. The method according to claim 1, wherein the amorphous ALD layer is recrystallized by exposure to a temperature between 100° C. and 140° C. inclusive.

6. The method according to claim 1, wherein the amorphous ALD layer is recrystallized by exposure to a pressure between 1 mbar bar and 3.0 bar inclusive.

7. The method according to claim 1, wherein the amorphous ALD layer is recrystallized by exposure to a humidity in which a water content of a gaseous medium at least partly surrounding the amorphous ALD layer is between 50% and 100% relative humidity inclusive.

8. The method according to claim 7, wherein no water condenses on the amorphous ALD layer from the gaseous medium.

9. The method according to claim 1, wherein the crystalline layer comprises γ-AlOOH, and wherein the crystalline layer is converted to crystalline γ-$Al_2O_3$ by annealing.

10. The method according to claim 1, wherein the crystalline layer is catalytically active.

11. An optoelectronic component comprising:
    a carrier; and
    a crystalline layer attached to the carrier in a mechanically stable manner and without a joining layer, wherein the crystalline layer comprises aluminum oxyhydroxide (γ-AlOOH).

12. The optoelectronic component according to claim 11, wherein the crystalline layer is covalently coupled to the carrier.

13. The optoelectronic component according to claim 11, wherein the carrier comprises one of the following materials: a III/V compound semiconductor material, germanium, silicon, glass.

14. The optoelectronic component according to claim 11, wherein the crystalline layer has an RMS roughness $R_q$ of at least 5 nanometers.

15. The optoelectronic component according to claim 11, wherein a main surface of the carrier on which the crystalline layer is located has a patterning, an aspect ratio of which is at least 0.2.

16. The optoelectronic component according to claim 11, wherein the crystalline layer acts as a light extraction layer or a passivation layer.

17. An optoelectronic component comprising:
a carrier; and
a crystalline layer attached to the carrier in a mechanically stable manner and without a joining layer, wherein the crystalline layer comprises aluminum oxyhydroxide (γ-AlOOH), wherein the crystalline layer acts as a light extraction layer or a passivation layer.

* * * * *